(12) United States Patent
Ylamurto (10) Patent No.: US 8,884,688 B1
(45) Date of Patent: Nov. 11, 2014

(54) HIGHER-ORDER LOAD CIRCUIT

(71) Applicant: Nokia Corporation, Espoo (FI)

(72) Inventor: Tommi Ylamurto, Los Gatos, CA (US)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 14/100,764

(22) Filed: Dec. 9, 2013

(51) Int. Cl.
*H03B 1/00* (2006.01)
*H03F 1/34* (2006.01)

(52) U.S. Cl.
CPC ........................................ *H03F 1/34* (2013.01)
USPC ......................................................... 327/556

(58) Field of Classification Search
USPC .................. 327/551, 552, 556, 557, 558, 559
See application file for complete search history.

(56) References Cited

U.S. PATENT DOCUMENTS

| 7,541,863 | B2 | 6/2009 | Vilhonen | |
| 8,269,551 | B2* | 9/2012 | Liao | 327/553 |
| 8,354,880 | B2* | 1/2013 | Volpe | 327/557 |

OTHER PUBLICATIONS

Ghaffari et al., "Tunable N-Path Notch Filters for Blocker Suppression: Modeling and Verification", IEEE Journal of Solid-State Circuits, vol. 48, Issue 6, Jun. 2013, pp. 1370-1382.
Franks et al., "An Alternative Approach to the Realization of Network Transfer Functions: The N-Path Filter", The Bell System Technical Journal, vol. 39, Issue 5, Sep. 1960, pp. 1321-1350.
Darvishi et al., "A 0.1-to-1.2GHz Tunable 6th-Order N-Path Channel-Select Filter with 0.6dB Passband Ripple and +7dBm Blocker Tolerance", IEEE International Solid-State Circuits Conference Digest of Technical Papers, Feb. 17-21, 2013, pp. 172-173.
Darvishi et al., "Widely Tunable 4th Order Switched Gm -C Band-Pass Filter Based on N-Path Filters", IEEE Journal of Solid-State Circuits, vol. 47, Issue 12, Dec. 2012, pp. 3105-3119.
Khatri et al., "An Active Transmitter Leakage Suppression Technique for CMOS SAW-Less CDNA Receivers", IEEE Journal of Solid-State Circuits, vol. 45, Issue 8, Aug. 2010, pp. 1590-1601.
Mohammadpour et al., "An N-Path Enhanced-Q Tunable Filter With Reduced Harmonic Fold Back Effects", IEEE Transactions on Circuits and Systems I: Regular Papers, vol. 60, Issue 11, Nov. 2013, pp. 2867-2877.

* cited by examiner

*Primary Examiner* — Jeffrey Zweizig
(74) *Attorney, Agent, or Firm* — Nokia Corporation (57) ABSTRACT

Methods and apparatus, including computer program products, are provided for filtering. In some example embodiments, there is provided an apparatus including a first differential amplifier including a first positive input, a first negative input, and a first output, wherein the first positive input is connected to the first output via at least a first capacitor, and wherein the first negative input is connected to the first output via at least a first resistor; and a second differential amplifier including a second input, a third input, and a second output, wherein the second input is connected to the second output via at least a third resistor, wherein the third input is connected to the second output via at least a second capacitor, and wherein an input is connected to the first positive input and the second input via at least a third capacitor. Related apparatus, systems, methods, and articles are also described.

19 Claims, 8 Drawing Sheets

HIGHER-ORDER LOAD CIRCUIT

FIELD

The subject matter described herein relates to filtering.

BACKGROUND

Radio transmitters and/or radio receivers may implement filtering in order to co-exist with other users and systems occupying neighboring channels and frequency bands. Moreover, in some radios a plurality of band selection filters may be used for each receive band and/or transmission band. When devices support several bands, multiple filters may be used for each band. However, these filters may be implemented with bulky and costly technologies not integrated with the rest of radio.

Although some cellular standards currently support about 4 or more bands, future cellular standards may support additional bands (for example, up to and exceeding 40 bands). In the case of a transmitter, the corresponding filters may be configured to primarily transmit noise that is outside of the transmit band. There is, however, a strict requirement with cellular radios regarding how much noise a transmitter can radiate inside the transmit band, so tunable narrowband filters may comply with that requirement. In the case of a receiver, a filter may also be used for channel selection inside a receive frequency band. This filter may be located at baseband, so only one filter is needed in a radio. However, some radios may not have traditional baseband processing, so any noise filtering may be done at the radio frequency front end. For example, N-path filter or trans-impedance filter may be used to provide channel selection at radio frequencies rather than at baseband. These filters may introduce low impedance for the interfering signals and high impedance for the desired signal. When this kind of impedance load is driven from a high impedance source, the interfering signals are attenuated.

SUMMARY

Methods and apparatus, including computer program products, are provided for filtering using a higher-order load circuit.

In some example embodiments, there may be provided an apparatus. The apparatus may include a first differential amplifier including a first positive input, a first negative input, and a first output, wherein the first positive input is connected to the first output via at least a first capacitor, and wherein the first negative input is connected to the first output via at least a first resistor; and a second differential amplifier including a second input, a third input, and a second output, wherein the second input is connected to the second output via at least a third resistor, wherein the third input is connected to the second output via at least a second capacitor, and wherein an input is connected to the first positive input and the second input via at least a third capacitor.

In some variations, one or more of the features disclosed herein including the following features can optionally be included in any feasible combination. The apparatus may be coupled to at least one of an N-path filter and a trans-impedance filter. The apparatus may be configured to provide a short at one or more frequencies and a high impedance at one or more other frequencies. The one or more frequencies filtered out may be at least an unwanted signal. The second input may have a positive polarity and the third input may have a negative polarity. The second input may have a negative polarity, and the third input may have a positive polarity. The first negative input may be connected to the first output via at least the first resistor and to a ground via a second resistor. The input may be connected to the first positive input and the second input via the third capacitor and to the second output via a fifth resistor. The third input may be connected to the second output via the second capacitor and to the ground via a fourth resistor.

The above-noted aspects and features may be implemented in systems, apparatus, methods, and/or articles depending on the desired configuration. The details of one or more variations of the subject matter described herein are set forth in the accompanying drawings and the description below. Features and advantages of the subject matter described herein will be apparent from the description and drawings, and from the claims.

DESCRIPTION OF THE DRAWINGS

In the drawings.

Like labels are used to refer to same or similar items in the drawings.

DETAILED DESCRIPTION

In some example embodiments, there is provided a higher-order load circuit that can be used in a filter, such as an N-path filter or trans-impedance filter, to provide low impedance for the unwanted (for example, interfering) signal(s) and high impedance for the wanted signal(s). In some example embodiments, the filters including the higher-order load circuit may be tunable across a transmit band of interest or a receive band of interest.

Figure 1:
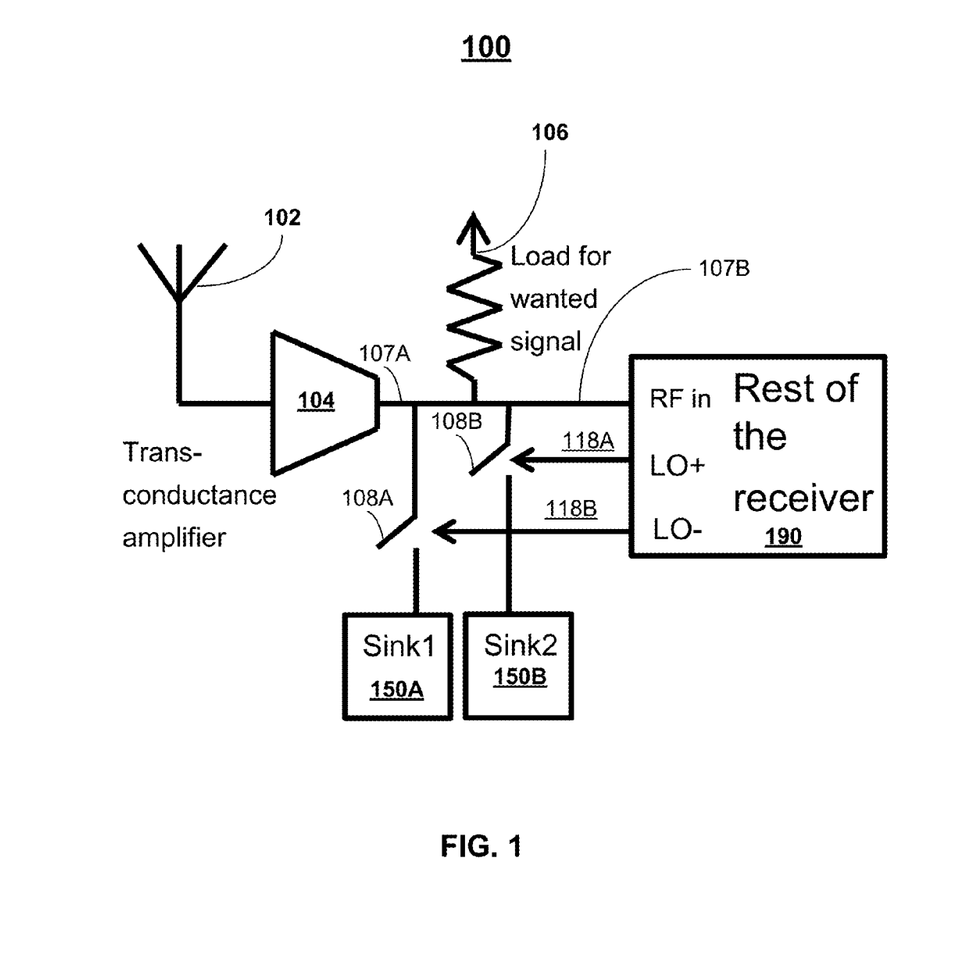
FIGS. 1 and 2 depict block diagrams of example implementations of receivers, in accordance with some example embodiments.

FIG. 1 depicts an example of a receive chain 100 of a radio, in accordance with some example embodiments. The receive chain 100 may include an antenna 102, a transconductance amplifier 104, sinks 150A-B for the unwanted signals, an output load 106 for the signal(s) of interest, passive mixers 108A-B to downconvert the unwanted components of the output signal 107A, and the rest of the receiver 190 (or another receiver). The mixers may be implemented using components, such as switches coupled to local oscillators 118A-B. In some example embodiments, receive chain 100 may be implemented using differential signals.

In the example of FIG. 1, sinks 150A-B may represent a short circuit at frequencies at or near those of the unwanted signal and an open circuit at or near the wanted signal frequencies. Signal may refer to a signal or a plurality of signals unless explicitly stated otherwise or clear from its context. Accordingly, the transconductance amplifier output signal current 107A may be split between the load 106 and sinks 105A-B. The high-impedance characteristics of the sinks 150A-B at the frequencies of the desired signal allow the desired signals to travel to the load 106 while the unwanted signals travel to sinks 150A-B. The resulting filtered signal 107B can be further processed by the rest of the receiver 190. In some example embodiments, the load 106 can be part of the input impedance of the receiver 190. In some example embodiments, the sinks 150A-B may be implemented as a higher-order load circuit, rather than a first order filter that provides a relatively slow transition from pass band to the stop band. The local oscillators (LO) represent clocks used to downconvert signals.

Figure 2:
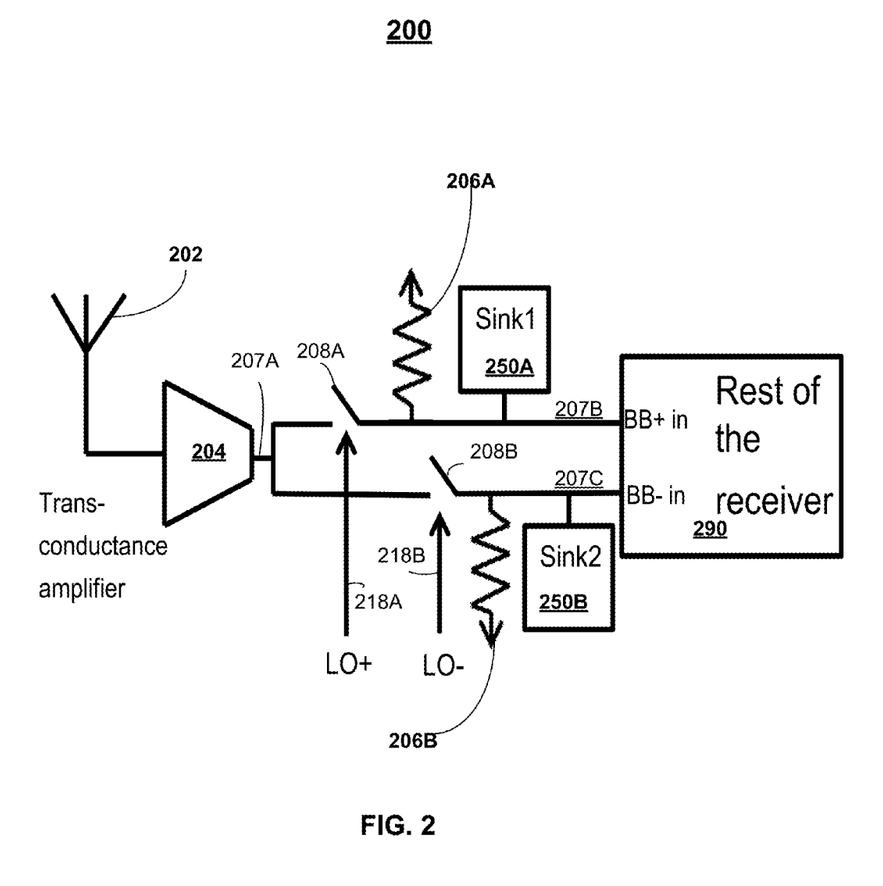

FIG. 2 depicts an example of a receive chain 200 of a radio, in accordance with some example embodiments. The receive chain 200 may include an antenna 202, a transconductance amplifier 204, sinks 250A-B, output loads 206A-B, and the rest of the receiver 290. The receive chain 200 includes a first passive mixer 208A and a second passive mixer 208B to downconvert the RF signal into a lower frequency. FIG. 2 is similar to FIG. 1 in some respects, but FIG. 1 depicts two parallel receivers, one for the wanted signal (for example, receiver 190) and one for the unwanted signal (for example, mixers 108A-B and sinks 150A-B).

In the example of FIG. 2, the sinks 250A-B may be implemented in a manner similar to the sinks 150A-B. For example, sinks 250A-B may represent a short (for example, low impedance) at or near frequencies of the unwanted signal and an open circuit (for example, high impedance) at or near the frequencies of the wanted signal. As such, as signals travel from 207A through the downconversion mixers 208A-B, the sinks 250A-B short to ground the unwanted signal while the wanted signals travel to the loads 206A-B. The filtered signals at loads 207B-C may be further processed by the rest of the receiver 290. In some example embodiments, the loads 206A-B may be part of the input impedance of the receiver 290. In some example embodiments, the sinks 250A-B may be implemented as higher-order load circuits, rather than a first order circuits that provides a relatively slow transition from pass band to the stop band.

Figure 3:
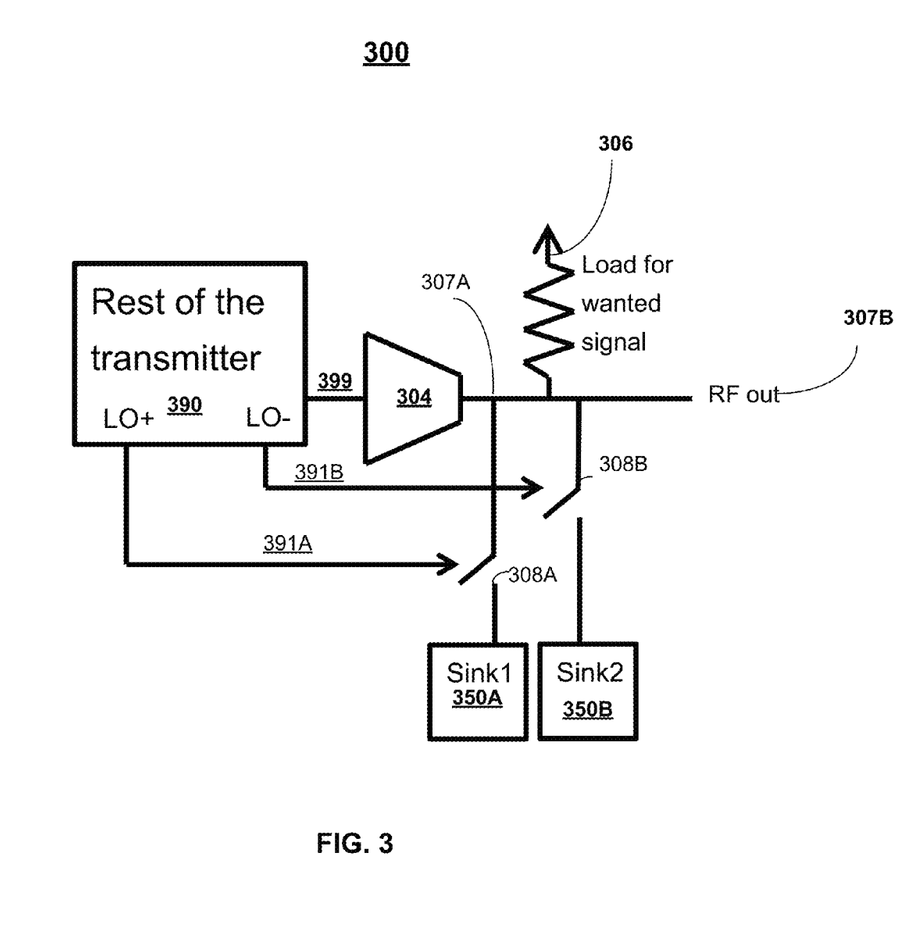
FIG. 3 depicts a block diagram of an example implementation of transmitter, in accordance with some example embodiments.

FIG. 3 depicts an example of a transmit chain 300 of a radio, in accordance with some example embodiments. The transmit chain 300 may include a portion of the transmitter 390 providing for example the signal to be filtered 399, a transconductance amplifier 304, sinks 350A-B, an output load 306, and passive mixers 308A-B, which provide downconversion based on local oscillators 391A-B.

In the example of FIG. 3, the sinks 350A-B may be implemented in a manner similar to the sinks 150A-B and 250A-B. As such, sinks 350A-B represent a short at or near frequencies of the unwanted signal downconverted by mixers 308A-B and high impedances at or near the frequencies of the wanted signal. The local oscillators (or clock signals) 391A-B may be the same used by the rest of the transmitter to upconvert the wanted signal to RF or some other frequency. In the example of FIG. 3, the desired signals at the frequencies of interest pass to the output 307B for transmission via for example an antenna and the like. In some example embodiments, the sinks 350A-B may be implemented as higher-order load circuits, rather than first order circuits that provide a relatively slow transition from pass band to the stop band.

In some example embodiments, the subject matter disclosed herein may implement a higher-order load (or sink) circuit. In addition, the higher-order load (or sink) circuit may be configured to have high impedance at one or more frequencies for a signal of interest and act as a short at one or more other frequencies for an unwanted signal. Furthermore, N-path filters or trans-impedance filters may, in some example embodiments, include the higher-order sink circuit disclosed herein.

In some example embodiments, the N-path filters or trans-impedance filters including higher-order sink circuits may provide multiband filters and/or tunable multiband filters at radio frequencies.

Figure 4:
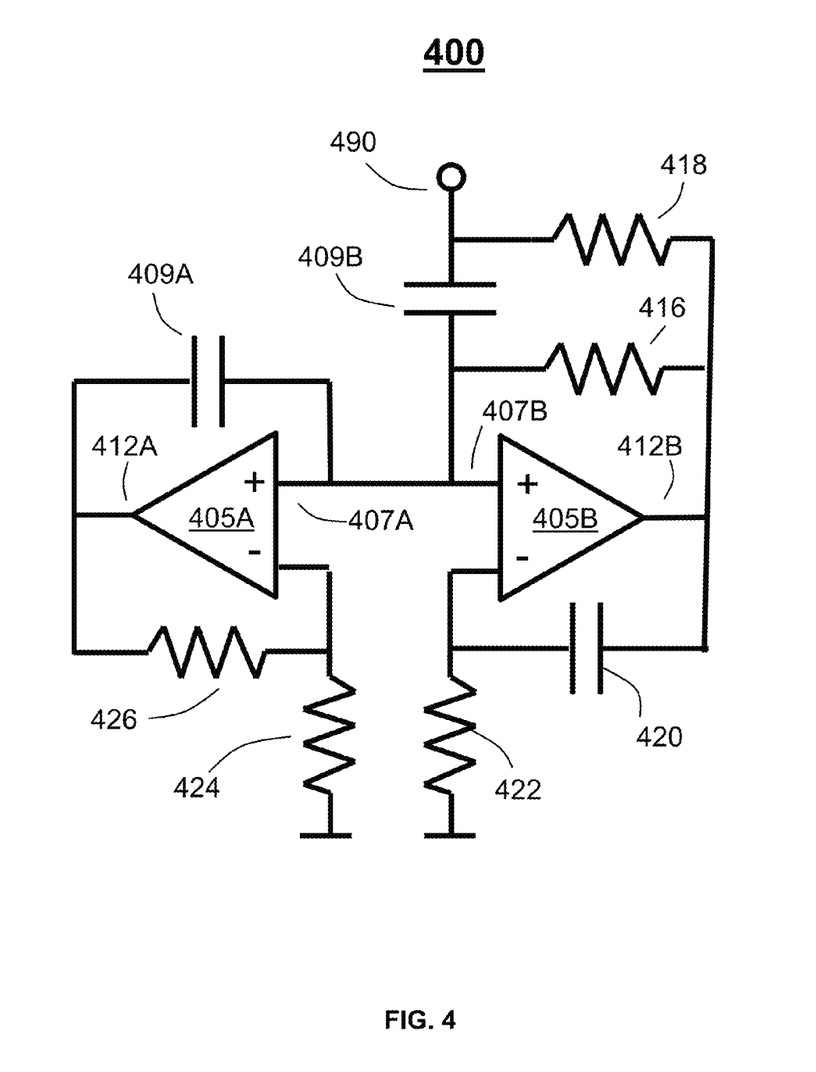
FIG. 4 depicts a block diagram of an example higher-order load circuit, in accordance with some example embodiments.

FIG. 4 depicts an example of a higher-order load circuit 400, in accordance with some example embodiments. The higher-order load circuit 400 (also referred to as a higher-order sink circuit) may include two high gain differential amplifiers 405A-B. The two high gain differential amplifiers 405A-B may have positive inputs 407A-B coupled together. Specifically, positive inputs 407A-B may be coupled to corresponding capacitors 409A-B.

In some example embodiments, high gain differential amplifier 405A may have capacitive feedback 409A from the output 412A to the positive input 407A. In some example embodiments, high gain differential amplifier 405B may have resistive feedback 416 from the output 412B to the positive input 407B.

High gain differential amplifier 405A may have feedback from the output 412A that provides half of the output voltage into the negative input port, while high gain differential amplifiers 405B may have feedback from the output 412B that provides the output signal to the negative input port at high frequencies and attenuates the low frequencies. Thus, high gain differential amplifiers 405A may be considered to implement negative capacitance, and high gain differential amplifiers 405B may be considered to implement negative inductance.

The input 490 may correspond to an input to, for example, a sink circuit, such as sink circuits 150A-B, 250A-B, and/or 350A-B. For example, input 490 may provide a short (for example, substantially a short or a low impedance) at or near the unwanted frequencies and an open circuit (for example, a high impedance) to signals at or near the frequencies of interest, so that the signals at frequencies of interest pass to other portions of the receiver or transmitter. The input 490 may also include a resistive component 418 to the outputs of the amplifiers 405A-B.

Although the transconductance amplifiers 405A-B show a certain polarity at the inputs, the polarity may be changed.

Figure 5:
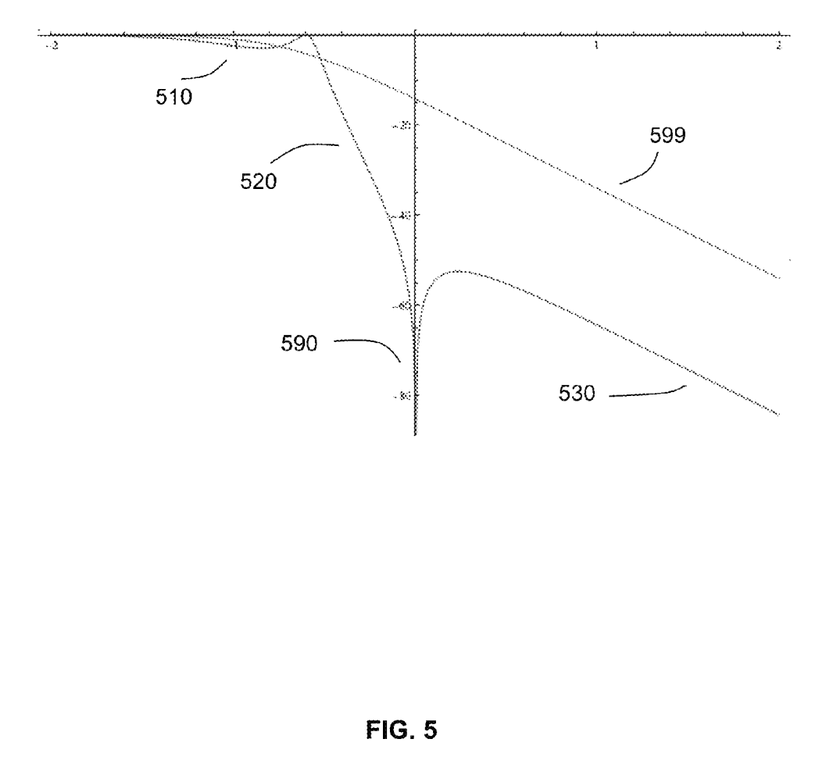
FIGS. 5 and 6 depict examples of spectrum plots for a higher-order load circuit, in accordance with some example embodiments.

FIG. 5 depicts an example frequency dependent input impedance 510, 520, 530 and 590 for higher-order load circuit 400, in accordance with some example embodiments. A first order spectrum for a capacitive load circuit is also depicted at 599. FIG. 5 shows that at a certain frequency the higher-order load circuit may provide a short 590 and low impedance at frequencies 530 but high impedances at frequencies, such as 510. When the certain frequency is selected or tuned to short the unwanted frequencies, then they are removed before being passed on to an output or another portion of the circuit. Because load circuit 400 is higher-order, the sharpness and roll off 520 associated with higher-order load circuit 400 is better, when compared to first-order circuit impedance 599.

In some example embodiments, component values at FIG. 4 may be adapted to change the frequency response to correspond any changes in the bandwidth of the wanted signal or any changes in the unwanted signals.

Figure 6:
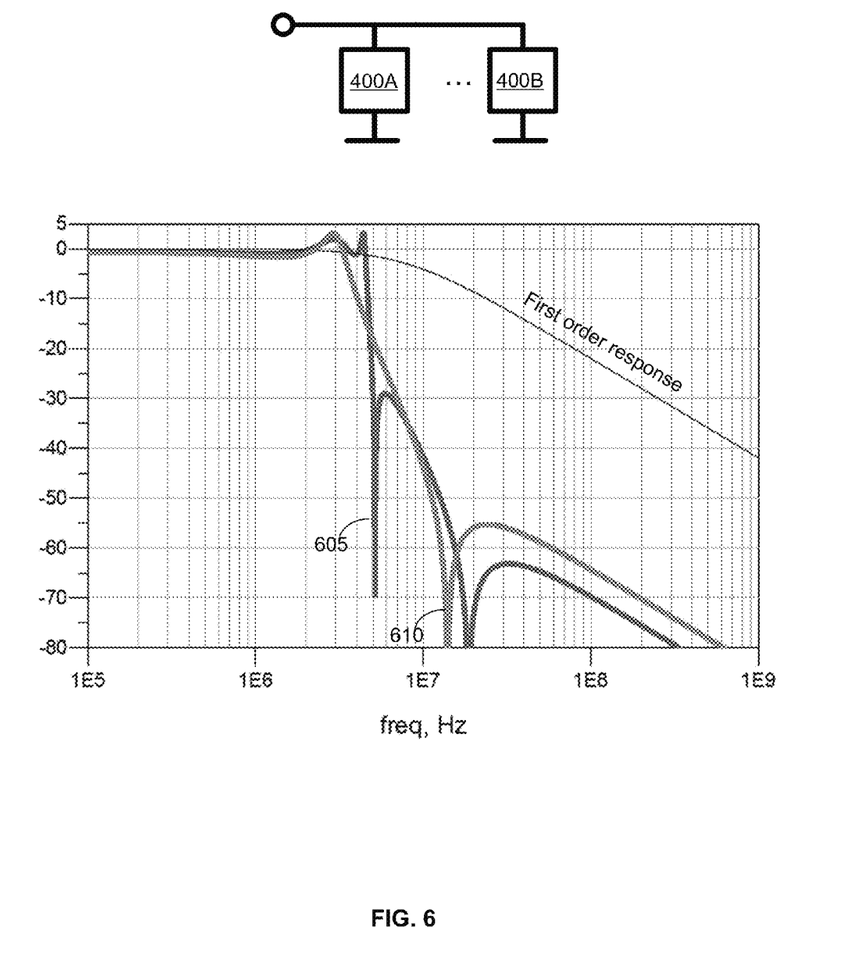

FIG. 6 depicts connecting two of the higher-order load circuits 400A-B in parallel, in accordance with some example embodiments. For example, sink 350A may be implemented as two sinks 350A in parallel, each having different frequency responses resulting in more transmission zeros and sharper transition band as in 605 compared to the single load circuit 610. The parallel higher-order load/sink circuits may also provide higher-order filters. Moreover, multiple pass bands (or shorts) may be implemented as well.

Figure 7:
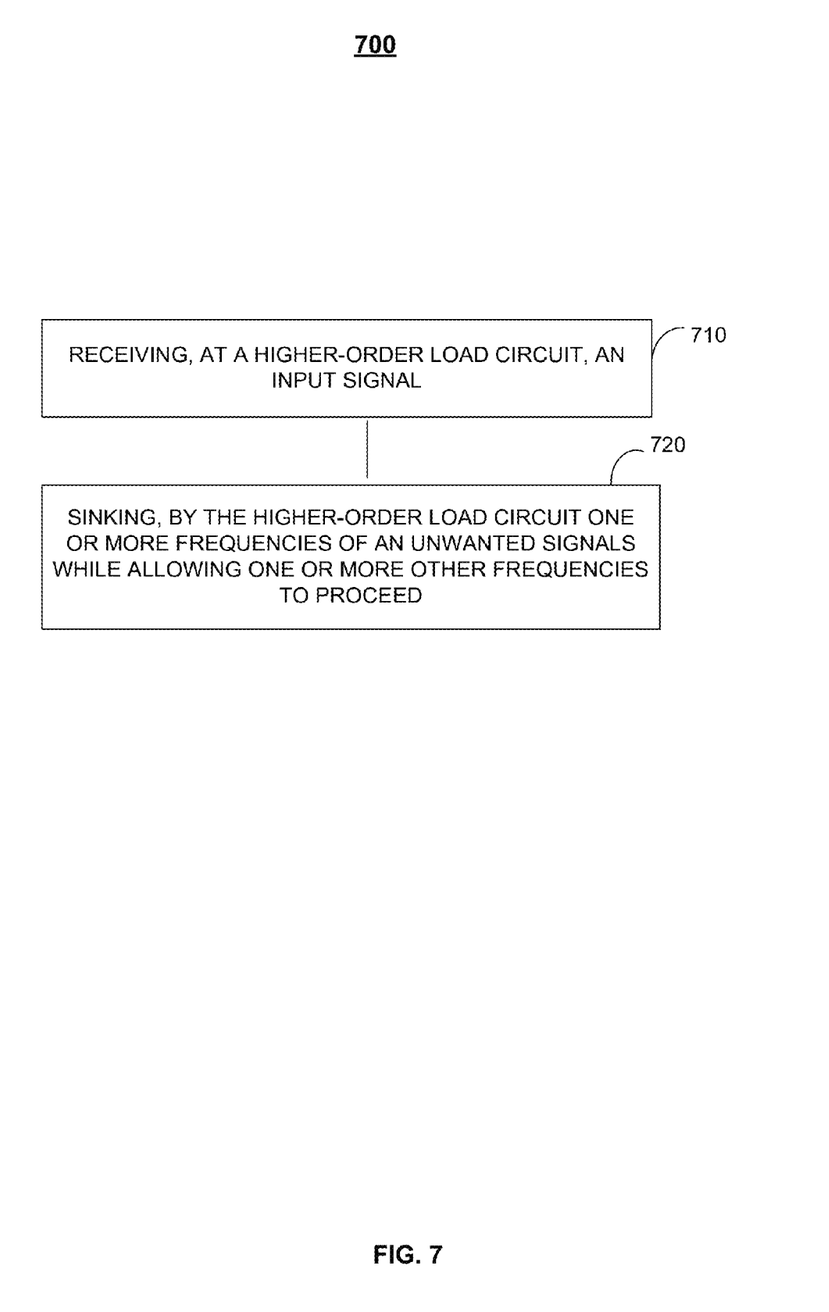
FIG. 7 depicts a process flow for an example higher-order load circuit, in accordance with some example embodiments.

FIG. 7 depicts a process 700, in accordance with some example embodiments.

At 710, a signal may be connected at an input to a higher-order sink circuit. For example, sink circuits 150A-B, 250A-B, and/or 350A-B may receive an input signal current.

At 720, sinking, by the higher-order sink circuit, current at one or more frequencies representing unwanted signals, while allowing one or more other frequencies corresponding to signals of interest to pass and thus allowing them to be processed by other circuits. For example, sink circuits 150A-B, 250A-B, and/or 350A-B may provide low impedance at one or more frequencies, such as frequencies shown at 590 (FIG. 5) and 605 and 610 (FIG. 6), so that these frequencies do not pass. However, sink circuits 150A-B, 250A-B, and/or 350A-B may provide a high impedance at one or more other frequencies, so these other frequencies may pass the sink and proceed to other portions of a receiver or transmitter.

Figure 8:
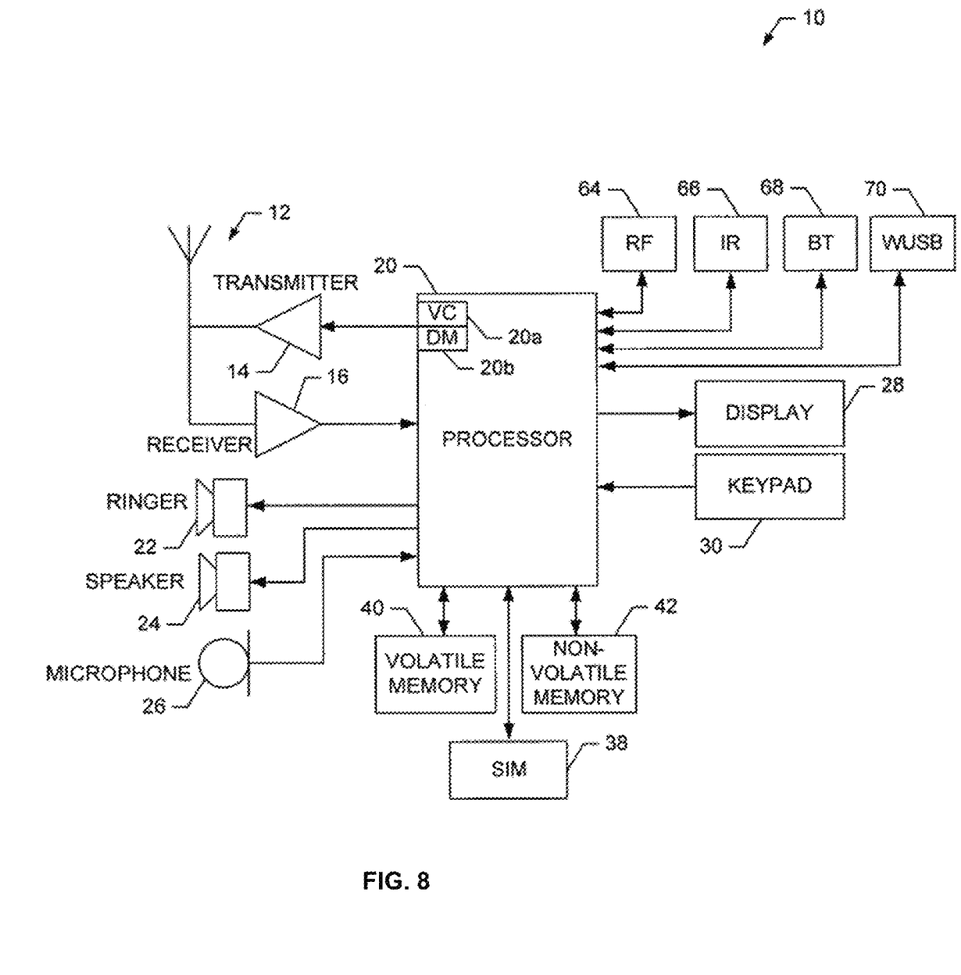
FIG. 8 depicts an example of a user equipment, in accordance with some example embodiments.

FIG. 8 illustrates a block diagram of an apparatus 10, in accordance with some example embodiments. For example, apparatus 10 may comprise a user equipment, such as a smart phone, smart object, mobile station, a mobile unit, a subscriber station, a wireless terminal, a tablet, a wireless plug-in accessory, or any other wireless.

The apparatus 10 may include at least one antenna 12 in communication with a transmitter 14 and a receiver 16. Alternatively transmit and receive antennas may be separate.

In some example embodiments, the transmitter 14 and/or receiver 16 may include one or more filters, such as N-path filters or transconductance filters, having the higher-order load or sink circuit 150A-B, 250A-B, and/or 350A-B.

The apparatus 10 may also include a processor 20 configured to provide signals to and receive signals from the transmitter and receiver, respectively, and to control the functioning of the apparatus. Processor 20 may be configured to control the functioning of the transmitter and receiver by effecting control signaling via electrical leads to the transmitter and receiver. Likewise, processor 20 may be configured to control other elements of apparatus 10 by effecting control signaling via electrical leads connecting processor 20 to the other elements, such as a display or a memory. The processor 20 may, for example, be embodied in a variety of ways including circuitry, at least one processing core, one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits (for example, an application specific integrated circuit (ASIC), a field programmable gate array (FPGA), and/or the like), or some combination thereof. Accordingly, although illustrated in FIG. 8 as a single processor, in some example embodiments the processor 20 may comprise a plurality of processors or processing cores.

Signals sent and received by the processor 20 may include signaling information in accordance with an air interface standard of an applicable cellular system, and/or any number of different wireline or wireless networking techniques, comprising but not limited to Wi-Fi, wireless local access network (WLAN) techniques, such as Institute of Electrical and Electronics Engineers (IEEE) 802.11, 802.16, and/or the like. In addition, these signals may include speech data, user generated data, user requested data, and/or the like.

The apparatus 10 may be capable of operating with one or more air interface standards, communication protocols, modulation types, access types, and/or the like. For example, the apparatus 10 and/or a cellular modem therein may be capable of operating in accordance with various first generation (1G) communication protocols, second generation (2G or 2.5G) communication protocols, third-generation (3G) communication protocols, fourth-generation (4G) communication protocols, Internet Protocol Multimedia Subsystem (IMS) communication protocols (for example, session initiation protocol (SIP) and/or the like. For example, the apparatus 10 may be capable of operating in accordance with 2G wireless communication protocols IS-136, Time Division Multiple Access TDMA, Global System for Mobile communications, GSM, IS-95, Code Division Multiple Access, CDMA, and/or the like. In addition, for example, the apparatus 10 may be capable of operating in accordance with 2.5G wireless communication protocols General Packet Radio Service (GPRS), Enhanced Data GSM Environment (EDGE), and/or the like. Further, for example, the apparatus 10 may be capable of operating in accordance with 3G wireless communication protocols, such as Universal Mobile Telecommunications System (UMTS), Code Division Multiple Access 2000 (CDMA2000), Wideband Code Division Multiple Access (WCDMA), Time Division-Synchronous Code Division Multiple Access (TD-SCDMA), and/or the like. The apparatus 10 may be additionally capable of operating in accordance with 3.9G wireless communication protocols, such as Long Term Evolution (LTE), Evolved Universal Terrestrial Radio Access Network (E-UTRAN), and/or the like. Additionally, for example, the apparatus 10 may be capable of operating in accordance with 4G wireless communication protocols, such as LTE Advanced and/or the like as well as similar wireless communication protocols that may be subsequently developed.

It is understood that the processor 20 may include circuitry for implementing audio/video and logic functions of apparatus 10. For example, the processor 20 may comprise a digital signal processor device, a microprocessor device, an analog-to-digital converter, a digital-to-analog converter, and/or the like. Control and signal processing functions of the apparatus 10 may be allocated between these devices according to their respective capabilities. The processor 20 may additionally comprise an internal voice coder (VC) 20a, an internal data modem (DM) 20b, and/or the like. Further, the processor 20 may include functionality to operate one or more software programs, which may be stored in memory. In general, processor 20 and stored software instructions may be configured to cause apparatus 10 to perform actions. For example, processor 20 may be capable of operating a connectivity program, such as a web browser. The connectivity program may allow the apparatus 10 to transmit and receive web content, such as location-based content, according to a protocol, such as wireless application protocol, WAP, hypertext transfer protocol, HTTP, and/or the like.

Apparatus 10 may also comprise a user interface including, for example, an earphone or speaker 24, a ringer 22, a microphone 26, a display 28, a user input interface, and/or the like, which may be operationally coupled to the processor 20. The display 28 may, as noted above, include a touch sensitive display, where a user may touch and/or gesture to make selections, enter values, and/or the like. The processor 20 may also include user interface circuitry configured to control at least some functions of one or more elements of the user interface, such as the speaker 24, the ringer 22, the microphone 26, the display 28, and/or the like. The processor 20 and/or user interface circuitry comprising the processor 20 may be configured to control one or more functions of one or more elements of the user interface through computer program instructions, for example, software and/or firmware, stored on a memory accessible to the processor 20, for example, volatile memory 40, non-volatile memory 42, and/or the like. The apparatus 10 may include a battery for powering various circuits related to the mobile terminal, for example, a circuit to provide mechanical vibration as a detectable output. The user input interface may comprise devices allowing the apparatus 20 to receive data, such as a keypad 30 (which can be a virtual keyboard presented on display 28 or an externally coupled keyboard) and/or other input devices.

As shown in FIG. 8, apparatus 10 may also include one or more mechanisms for sharing and/or obtaining data. For example, the apparatus 10 may include a short-range radio frequency (RF) transceiver and/or interrogator 64, so data may be shared with and/or obtained from electronic devices in accordance with RF techniques. The apparatus 10 may include other short-range transceivers, such as an infrared (IR) transceiver 66, a Bluetooth (BT) transceiver 68 operating using Bluetooth wireless technology, a wireless universal serial bus (USB) transceiver 70, a Bluetooth Low Energy transceiver, a ZigBee transceiver, an ANT transceiver, a cellular device-to-device transceiver, a wireless local area link transceiver, and/or any other short-range radio technology. Apparatus 10 and, in particular, the short-range transceiver may be capable of transmitting data to and/or receiving data from electronic devices within the proximity of the apparatus, such as within 10 meters, for example. The apparatus 10 including the WiFi or wireless local area networking modem may also be capable of transmitting and/or receiving data from electronic devices according to various wireless networking techniques, including 6LoWpan, Wi-Fi, Wi-Fi low power, WLAN techniques such as IEEE 802.11 techniques, IEEE 802.15 techniques, IEEE 802.16 techniques, and/or the like.

The apparatus 10 may comprise memory, such as a subscriber identity module (SIM) 38, a removable user identity module (R-UIM), an eUICC, an UICC, and/or the like, which may store information elements related to a mobile subscriber. In addition to the SIM, the apparatus 10 may include other removable and/or fixed memory. The apparatus 10 may include volatile memory 40 and/or non-volatile memory 42. For example, volatile memory 40 may include Random Access Memory (RAM) including dynamic and/or static RAM, on-chip or off-chip cache memory, and/or the like. Non-volatile memory 42, which may be embedded and/or removable, may include, for example, read-only memory, flash memory, magnetic storage devices, for example, hard disks, floppy disk drives, magnetic tape, optical disc drives and/or media, non-volatile random access memory (NVRAM), and/or the like. Like volatile memory 40, non-volatile memory 42 may include a cache area for temporary storage of data. At least part of the volatile and/or non-volatile memory may be embedded in processor 20. The memories may store one or more software programs, instructions, pieces of information, data, and/or the like which may be used by the apparatus for performing functions of the user equipment/mobile terminal. The memories may comprise an identifier, such as an international mobile equipment identification (IMEI) code, capable of uniquely identifying apparatus 10. The functions may include one or more of the operations disclosed with respect to the higher-order load/sink circuits including process 700 and the like. The memories may comprise an identifier, such as an international mobile equipment identification (IMEI) code, capable of uniquely identifying apparatus 10. In the example embodiment, the processor 20 may be configured using computer code stored at memory 40 and/or 42 to operations disclosed herein with respect to process 700 and the like.

Some of the embodiments disclosed herein may be implemented in software, hardware, application logic, or a combination of software, hardware, and application logic. The software, application logic, and/or hardware may reside on memory 40, the control apparatus 20, or electronic components, for example. In some example embodiment, the application logic, software or an instruction set is maintained on any one of various conventional computer-readable media. In the context of this document, a "computer-readable medium" may be any non-transitory media that can contain, store, communicate, propagate or transport the instructions for use by or in connection with an instruction execution system, apparatus, or device, such as a computer or data processor circuitry, with examples depicted at FIG. 8, computer-readable medium may comprise a non-transitory computer-readable storage medium that may be any media that can contain or store the instructions for use by or in connection with an instruction execution system, apparatus, or device, such as a computer.

Without in any way limiting the scope, interpretation, or application of the claims appearing below, a technical effect of one or more of the example embodiments disclosed herein is providing filters with sharper filters with nulls in a frequency response and providing multiple bands.

If desired, the different functions discussed herein may be performed in a different order and/or concurrently with each other. Furthermore, if desired, one or more of the above-described functions may be optional or may be combined. Although various aspects of the invention are set out in the independent claims, other aspects of the invention comprise other combinations of features from the described embodiments and/or the dependent claims with the features of the independent claims, and not solely the combinations explicitly set out in the claims. It is also noted herein that while the above describes example embodiments, these descriptions should not be viewed in a limiting sense. Rather, there are several variations and modifications that may be made without departing from the scope of the present invention as defined in the appended claims. Other embodiments may be within the scope of the following claims. The term "based on" includes "based on at least." The use of the phase "such as" means "such as for example" unless otherwise indicated.

What is claimed:

1. An apparatus comprising:
   a first differential amplifier including a first positive input, a first negative input, and a first output, wherein the first positive input is connected to the first output via at least a first capacitor, and wherein the first negative input is connected to the first output via at least a first resistor; and
   a second differential amplifier including a second input, a third input, and a second output, wherein the second input is connected to the second output via at least a third resistor, wherein the third input is connected to the second output via at least a second capacitor, and wherein an input is connected to the first positive input and the second input via at least a third capacitor.

2. The apparatus of claim 1, wherein at least one of the apparatus is coupled to at least one of an N-path filter and a trans-impedance filter.

3. The apparatus of claim 2, wherein the apparatus is configured to provide a short at one or more frequencies and a high impedance at one or more other frequencies.

4. The apparatus of claim 3, wherein the one or more frequencies filter out at least an unwanted signal.

5. The apparatus of claim 1, wherein the second input has a positive polarity and the third input has a negative polarity.

6. The apparatus of claim 1, wherein the second input has a negative polarity, and the third input has a positive polarity.

7. The apparatus of claim 1, wherein the first negative input is connected to the first output via at least the first resistor and to a ground via a second resistor.

8. The apparatus of claim 1, wherein the input is connected to the first positive input and the second input via the third capacitor and to the second output via a fifth resistor.

9. The apparatus of claim 1, wherein the third input is connected to the second output via the second capacitor and to the ground via a fourth resistor.

10. A method comprising:
receiving, at an input of a load circuit, a signal, wherein the load circuit comprises a first differential amplifier including a first positive input, a first negative input, and a first output, wherein the first positive input is connected to the first output via at least a first capacitor, and wherein the first negative input is connected to the first output via at least a first resistor, wherein the load circuit further comprises a second differential amplifier including a second input, a third input, and a second output, wherein the second input is connected to the second output via at least a third resistor, wherein the third input is connected to the second output via at least a second capacitor, and wherein the input is connected to the first positive input and the second input via at least a third capacitor; and
sinking, by the load circuit, the received signal.

11. The method of claim 10, wherein at least one of the load circuit is coupled to at least one of an N-path filter and a trans-impedance filter.

12. The method of claim 11, wherein the load circuit is configured to provide the sinking by at least providing a short at one or more frequencies, wherein the load circuit further provides a high impedance at one or more other frequencies.

13. The method of claim 12, wherein the one or more frequencies filter out at least an unwanted signal.

14. The method of claim 11, wherein the second input has a positive polarity and the third input has a negative polarity.

15. The method of claim 11, wherein the second input has a negative polarity, and the third input has a positive polarity.

16. The method of claim 11, wherein the first negative input is connected to the first output via at least the first resistor and to a ground via a second resistor.

17. The method of claim 11, wherein the input is connected to the first positive input and the second input via the third capacitor and to the second output via a fifth resistor.

18. The method of claim 11, wherein the third input is connected to the second output via the second capacitor and to the ground via a fourth resistor.

19. A non-transitory computer-readable medium including code which when executed by at least one processor circuitry causes operations comprising:
receiving, at an input of a load circuit, a signal, wherein the load circuit comprises a first differential amplifier including a first positive input, a first negative input, and a first output, wherein the first positive input is connected to the first output via at least a first capacitor, and wherein the first negative input is connected to the first output via at least a first resistor, wherein the load circuit further comprises a second differential amplifier including a second input, a third input, and a second output, wherein the second input is connected to the second output via at least a third resistor, wherein the third input is connected to the second output via at least a second capacitor, and wherein the input is connected to the first positive input and the second input via at least a third capacitor; and
sinking, by the load circuit, the received signal.

\* \* \* \* \*